United States Patent [19]

Hsieh et al.

[11] 4,435,805
[45] Mar. 6, 1984

[54] TESTING OF LOGIC ARRAYS

[75] Inventors: John C. Hsieh; Wei-Wha Wu, both of Poughkeepsie, N.Y.

[73] Assignee: International Business Machines Corporation, Armonk, N.Y.

[21] Appl. No.: 270,435

[22] Filed: Jun. 4, 1981

[51] Int. Cl.³ .............................................. G06F 11/00
[52] U.S. Cl. ......................................... 371/25; 371/8; 371/15
[58] Field of Search ............... 371/8, 15, 25; 364/716, 364/200 MS File, 900 MS File, 147; 324/73 R

[56] References Cited

U.S. PATENT DOCUMENTS

| 3,813,650 | 5/1974 | Hunter | 340/172.5 |
|---|---|---|---|
| 3,958,110 | 5/1976 | Hong et al. | 371/15 |
| 3,987,286 | 10/1976 | Muehldorf | 235/152 |
| 4,025,902 | 5/1977 | Nakao et al. | 364/147 |
| 4,032,894 | 6/1977 | Williams | 364/716 |
| 4,124,899 | 11/1978 | Birkner et al. | 364/716 |
| 4,217,658 | 8/1980 | Henry et al. | 364/147 |
| 4,227,247 | 10/1980 | Kintner | 364/900 |
| 4,234,956 | 11/1980 | Addesley et al. | 371/8 |
| 4,244,034 | 1/1981 | Cherba | 364/900 |
| 4,249,246 | 2/1981 | Nanya et al. | 364/716 |
| 4,354,228 | 10/1982 | Moore et al. | 364/200 |

FOREIGN PATENT DOCUMENTS 963751 7/1964 United Kingdom .

OTHER PUBLICATIONS

IBM Technical Disclosure Bulletin, vol. 24, No. 1A, Jun. 1981, "PLA with Product Term Test Circuit", W. M. Chu and R. Colao, p. 131.
IBM Technical Disclosure Bulletin, vol. 20, No. 1, Jun. 1977, "PLA Macro Optimized Test Pattern Generation," Muehldorf et al. pp. 47–53.
IBM Technical Disclosure Bulletin, vol. 22, No. 5, Oct. 1979, "Pretesting Laserable PLA Peripheral Circuits," W. W. Wu pp. 1866–1869.
IBM Technical Disclosure Bulletin, vol. 21, No. 3, Aug. 1978, "Joining Metal Lines with a Laser Beam Tool", Scheverlein, pp. 1027–1028.
IBM Journal of Research and Development, vol. 19, No. 2, Mar. 1975, "An Introduction to Array Logic", Fleisher et al., pp. 98–109.

Primary Examiner—Jerry Smith
Assistant Examiner—Gary V. Harkcom
Attorney, Agent, or Firm—Mitchell S. Bigel

[57] ABSTRACT

A logic array includes a matrix of logical elements located at the intersections of a plurality of input and output lines. Due to the nature of the array structure, more than one output line may be activated by a given digital bit pattern placed on the input lines. In testing the array, the lack of a one-to-one correspondence makes it difficult to determine if the personalization associated with a given output line is proper.

The output line interference problem is solved by providing a deletion control line which may be selectively connected to any combination of output lines to thereby disable the connected output lines. Thus, a given output line may be personalized, tested and then disabled, to preclude interference between the tested output line and the remainder of the lines to be tested. Moreover, since the logic array is tested one line at a time, provision can be made for substituting spare output lines for defective output lines, thereby rendering a defective array usable.

8 Claims, 2 Drawing Figures

TESTING OF LOGIC ARRAYS

TECHNICAL FIELD

This invention generally relates to arrays or matrices which are used for performing logic functions, and more particularly to a logic array which includes provisions for fully testing the array logic function.

Logic arrays are presently used by digital circuit designers as alternatives to custom wired logic gate chains for implementing a given logic function. Logic arrays generally include a first plurality of input lines for accepting digital input signals, and a second plurality of orthogonally oriented output lines for providing digital output signals. A logical element is located at at least some of the intersections of input and output lines to form an array or matrix of logical elements.

As packaged in integrated circuit chip form, the logic array is not personalized, i.e., the logical elements are not connected. To implement a given logic function, the logical elements are personalized, i.e., selected logical elements are connected to their adjacent input and output lines. By connecting the proper logical elements, any desired logic function may be implemented. Techniques have been developed in the art for determining which logical elements should be personalized in order to implement a given logic function. Techniques have also been developed in the art to minimize the size of the array necessary to implement a given logic function.

Logic arrays are presently available employing various types of logical element technologies, e.g., Schottky barrier diodes, transistors, or FETs. Personalization takes place by either breaking a conductor connecting a logical element with an adjacent input or output line, or by melting adjacent conductors so that they weld to form a conducting path therebetween upon solidification to connect a logical element with an input or output line. The personalization technique depends generally upon the array technology. In either case, the breaking or welding may be accomplished through the use of a miniaturized laser.

Logic arrays are currently available in many sizes and in various array configurations, i.e., two or more arrays may be incorporated on a single chip in order to readily implement standardized logic functions. One currently available compound logic array configuration is the Programmable Logic Array (PLA) comprising a plurality of input and output columns and a plurality of rows orthogonal to the input and output columns. An "AND" or "product" array of logical elements is located at the intersections of the input columns and the rows, while an "OR" or "sum" array of logical elements is located at the intersections of the output columns and the rows. By virtue of the AND-OR array arrangement, standardized logic functions in the "sum of products" form may be readily implemented.

One of the major factors preventing more widespread use of logic arrays has been the difficulty encountered in the testing thereof. To fully test an array, two types of tests must be performed. First, the peripheral circuits on the array, e.g., latches, registers and inverters, must be tested. This testing may occur before personalization. Second, and more difficult, the logical elements in the array must be tested. This testing may only take place after personalization, since before personalization the logical elements are not connected to the output lines and are thus inaccessible. After personalization, those logical elements that were connected must be functionally tested for operability. The accuracy of the personalization must also be verified. It must be assured that each logical element that was supplied to be connected was indeed connected, and that no logical elements that were to remain unconnected were inadvertently connected.

BACKGROUND ART

The prior art has solved some of the difficulty encountered in testing the array peripheral circuits but the difficulty in testing the logical elements and array personalization remain. With regard to the testing of peripheral circuits, for example, IBM Technical Disclosure Bulletin, Vol. 22, No. 5, page 1866 entitled "Pretesting Laserable PLA Peripheral Circuits," discloses the testing of PLA peripheral circuits prior to personalization by providing additional test lines and test transistors connected to input test points.

The difficulties encountered in testing the logical elements and the accuracy of personalization have not been adequately solved by the prior art. One prior art technique for testing array personalization is to sequentially apply every possible input bit pattern to the array and monitor the array outputs against known correct outputs. Clearly, for a large array, this procedure can be tedious and time consuming, thereby negating the quick turn-around time obtained by using an array over custom logic. For example, if the array has 16 input lines, there are over 65,000 possible input bit patterns, each of which must be tested. Such a procedure is both time consuming and costly.

Besides being costly, the prior art technique for testing array personalization is inadequate in that it may not spot all possible personalization defects. This is so because in a logic array there is not a one-to-one correspondence between digital input patterns and array output lines activated. In other words, a given digital input pattern may activate more than one output line. An output from the logic array in response to a given input bit pattern may show that an array output line has been activated, but not necessarily the correct array output line. Thus, it is sometimes impossible to detect defective personalization even if many combinations of input patterns are applied.

As an example of the inadequacies of the prior art technique, consider the testing of the PLA structure described above. In order to minimize the PLA size for generating a given logic function, the array personalization includes many "don't cares." Due to the presence of "don't cares" in the array personalization, a given input pattern will generally activate more than one PLA row. If the output columns are monitored for a given logical output in response to a given digital input, it cannot be ascertained whether this logical output is due to the activation of the proper row or is due to another row being activated by the given digital input. Due to the nature of the associative match in the PLA, it may be impossible to detect the defective personalization of a given row.

DISCLOSURE OF THE INVENTION

It is a principle object of this invention to provide improved testing of logic arrays.

It is a further object of this invention to provide a logic array, the personalization of which is 100% testable.

It is still a further object of this invention to provide a logic array, the personalization of which is testable on a line by line basis.

It is still a further object of this invention to provide a logic array, the personalization of one line of which is testable without interference from the remaining lines.

These and other objects are accomplished by providing a logic array, the individual output lines of which may be disabled so that the disabled line will not provide an output despite the activation thereof by an appropriate input signal. Such a disabling means may be provided by the addition of a deletion control line and means for selectively connecting the deletion control line to one or more of the array output lines. When the deletion control line is connected to an array output line, the connected output line is disabled.

By providing for selective disabling of array output lines, personalization of a given output line may be tested without interference from the remainder of the array output lines. The entire array may be personalized and tested in a line by line fashion, as follows: The logical elements associated with the first output line are personalized. An input pattern which activates the first output line is then applied to the input lines, and the proper response to the input pattern is verified. The first output line is then connected to the deletion control line to disable the first output line for the remainder of the personalization and test operations. The second output line may then be tested as above without interference from the first output line.

The above personalizing and testing sequence is repeated for each output line until the entire array has been personalized and tested. After each output line is tested it is disabled to prevent interference with subsequent tests. Once the array has been fully personalized and tested, the deletion control line is deactivated thereby enabling all output lines for proper array operation.

By providing selective output line deletion, the testing of an entire array may be accomplished using only one input word per output line, greatly minimizing array test time. Further, since each output line is disabled after it is tested, interference with subsequent testing is precluded, to insure 100% testing of personalization.

When the deletion control line is incorporated into a logic array in accordance with the present invention, a further advantage results. Since personalization and testing is done on a line by line basis, it is immediately known when a given output line's personalization is defective. A defective array may be rendered usable by permanently deactivating the defective output line and personalizing another output line to the personalization pattern desired. By providing spare or extra output lines, substitution of spare lines for defective lines may take place, thereby rendering a defective array usable.

BEST MODE FOR CARRYING OUT THE INVENTION

Figure 1:
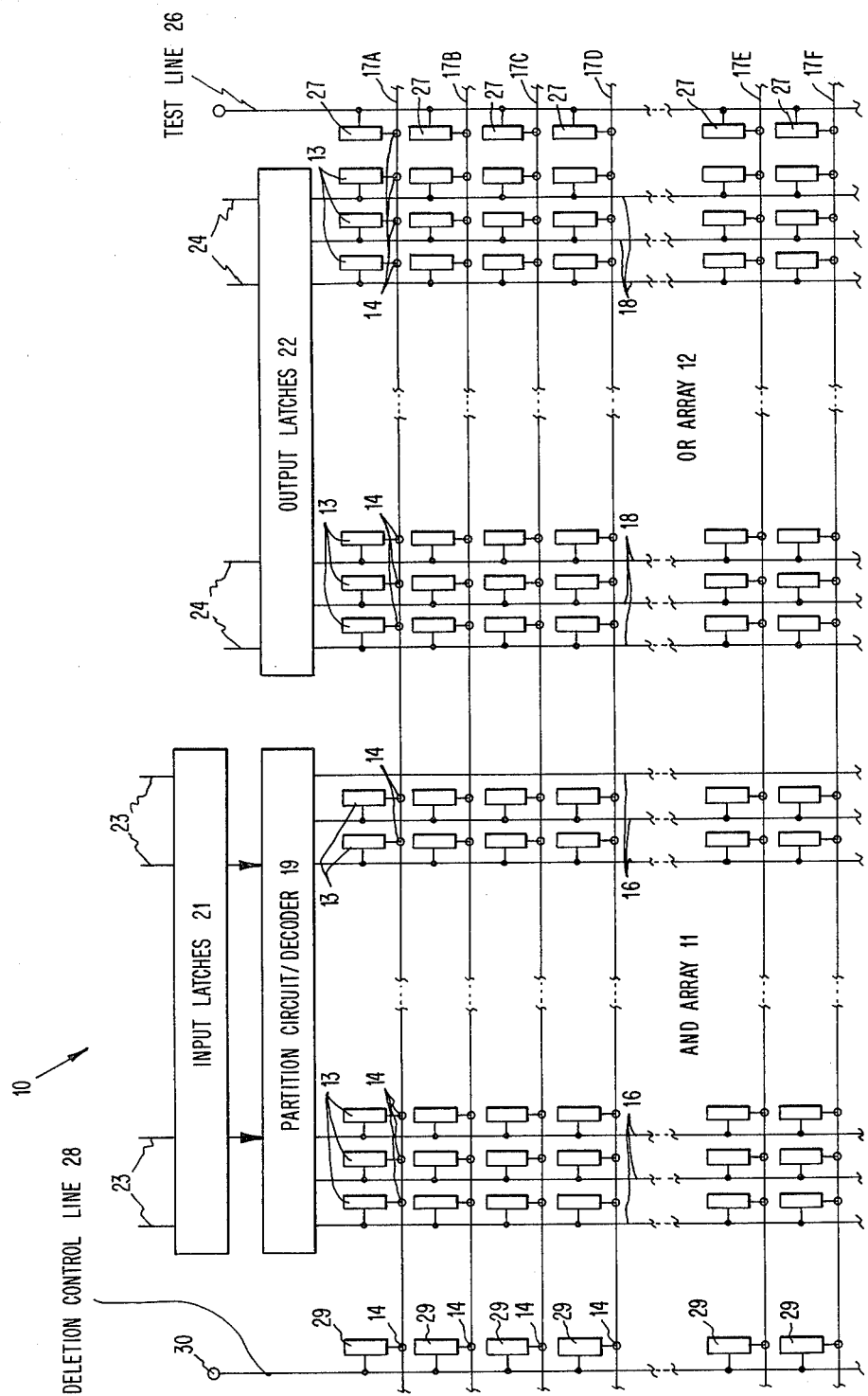
FIG. 1 is a schematic representation of a PLA in which the present invention is embodied.

Referring now to FIG. 1, there is shown a common form of logic array incorporating the present invention. This form of logic array is referred to as a programmable logic array (PLA), and is a compound logic array arrangement. As shown in FIG. 1, PLA 10 consists of two arrays; a first array 11 is generally referred to as an "AND" or "product" array and a second array 12 generally referred to as an "OR" or "sum" array. The output lines of the AND array are also the input lines for the OR array and will be referred to as PLA rows 17. Input lines 16 of the AND array will be referred to as input columns, the output lines 18 of the OR array will be referred to as output columns.

PLA 10 also includes additional peripheral circuitry. Input latches 21 are employed for storing digital input signals from inputs 23. Output latches 22 are employed for storing the PLA output to be provided on output lines 24. The array also may include a partition circuit or decoder 19. Partition circuits may be employed to minimize the number of input columns 16 by generating complementary logical functions of the input signals as will be described below with regard to FIG. 2.

At the intersection of every row 17 and input column 16, a logical element 13 is present, as there is at the intersection of every row 17 and output column 18. Logical elements 13 may be bipolar transistors, field effect transistors, diodes or other elements.

Initially, each logical element 13 is disconnected from either its adjacent row or column so that an open circuit is present. In FIG. 1, for example, each logical element 13 is connectd to an adjacent column 16 or 18 but is not connected to its adjacent row 17. Provision is made, however, for connecting a logical element 13 to its adjacent row 17 by application of laser energy to laser welding sites 14.

PLA 10 further includes a test line 26 orthogonal to PLA rows 17, and a connecting element 27 at the intersection of each row 17 and test line 26. Provision is made for connecting connection elements 27 to its adjacent row 17 by application of laser energy to laser welding sites 14.

Test line 26 is employed for monitoring the logical state of rows 17 which are connected to test line 26 by elements 27 in a "wired OR" configuration. If any of the PLA rows 17 are in their active logical state, test line 26 will also be active. Conversely, in order for test line 26 to be inactive, all rows 17 must be inactive. It will be understood by those having skill in the art that the terms "active" corresponds to logic high or low depending upon the particular PLA configuration state. Likewise the term "inactive" corresponds to the logic state which is not active, and may be logic high or low depending upon the particular PLA configuration.

To illustrate the problems encountered in attempting to test the PLA of FIG. 1, assume the array has been completely personalized. In order to test the personalization of a given row, for example, row 17c, a digital input pattern is impressed upon lines 23 such that the particular digital input pattern activates row 17c. If row 17c is in fact activated, then test line 26 will go active and the proper personalization of row 17c is assured. However, the input signal which activates row 17c may also activate other rows 17 of the PLA. This is because the PLA personalization pattern incorporates a large number of "don't cares." Unlike the case of a memory array, there is not a one-to-one correspondence between a given input signal and the array row which is activated. In the PLA, a given input signal will generally activate more than one row. Even if the row under test 17c is defective, and is not activated, one of the other rows 17 may be activated, and will activate test line 26. This will give the impression that the personalization of row 17c is proper when in fact it may not be proper.

As a consequence of the above described associative match in the PLA, a large number of digital input patterns are necessary to assure that the row under test is in fact activating test line 26. Moreover, this interference between rows may often preclude testing of a given row since it may not be possible to devise a group of input patterns by which it can be guaranteed that the personalization of a given row is correct.

The present invention permits 100% testing of array personalization by adding a deletion control line 28 to PLA 10. In FIG. 1, deletion control line 28 is an added column orthogonal to PLA rows 17. Deleting elements 29 are added between the deletion control line 28 and each row 17 of PLA 10. As will be seen from FIG. 1, provision is made for selectively connecting a deleting element 29 to an adjacent row 17 by laser welding, in the same manner as is done for logical elements 13. Preferably, although not necessarily, deletion elements 29 are of the same technology as logical elements 13.

Deletion control line 28 provides the capability of disabling a row 17 after it has been tested so that it will not interfere with testing of subsequent rows. In order to provide this capability, deletion control line 28 is connected at 30 to a suitable voltage source. The voltage level of the voltage source is such that when a deleting element 29 is connected to a row 17, the row 17 will be clamped at a logic level which precludes activation of test line 26, i.e., the row will be held at its inactive logic level. Obviously, the voltage level at 30 will depend upon the PLA technology, and may in fact be zero volts or ground potential.

The testing of the PLA of FIG. 1 in accordance with the present invention will now be described: Initially the PLA is in its unpersonalized state. Personalization and testing proceeds one row at a time. The logical elements of the first row 17a of AND array 11 are personalized according to a predetermined personalization pattern by laser welding. The connecting element 27 between test line 26 and row 17a is laser welded. The digital input bit pattern which activates the first row of AND array 11 is then applied to PLA input lines 23. If test line 26 is activated, this indicates that the personalization is accurate. The logical elements of the first row 17a of OR array 12 are then personalized according to a predetermined personalization pattern by laser welding. OR array personalization (first row) is then tested by applying the same digital input bit pattern which was applied above, and by observing PLA output lines 24 for proper output. Personalization and testing of row 17a are now complete.

In order to preclude personalized row 17a from interfering with the testing of subsequent rows, row 17a is disabled by laser welding the topmost deleting element 29 to row 17a. This maintains row 17a in its low inactive state regardless of the digital input presented on lines 23 and, row 17a cannot activate test line 26 during subsequent row testing. The personalization and testing procedure described above is then repeated for each subsequent row, on a row-by-row basis, until all of the rows have been individually personalized and tested.

Deletion control line 28 is then deactivated by connecting point 30 to a suitable voltage source (which may be zero volts) such that the connection of deleting elements 29 to rows 17 has no effect on the output of rows 17. This effectively deactivates the deletion control line, and all of the array rows may be employed to generate the PLA logical function.

In the above description it was assumed that the personalization of both the AND or OR arrays was correct when tested. If the personalization is not correct, as indicated by an inactive test line 26 for AND array personalization, or improper PLA output on lines 24 for OR array personalization, the entire PLA must be discarded. However, as will be described below, if spare or redundant rows are incorporated into the PLA of the present invention, the PLA may be used despite the existence of defective personalization thereon, by substituting a spare row for a defective row.

The PLA of FIG. 1 includes spare rows 17e and 17f. If, in testing rows 17a . . . 17d, one row, for example, 17b, is found to be defective, a spare row, such as 17e, may replace row 17b by personalizing spare row 17e with the proper personalization originally intended for defective row 17b. Spare row 17e is tested in accordance with the present invention in the same manner as a regular row. Defective row 17b may be permanently deleted, for instance, by laser personalizing the defective row to an unused input pattern, thus assuring that it will never be activated by a given input. It will be noted that defective row substitution may only be accomplished in a PLA incorporating the present invention, as otherwise it is impossible to determine when a given PLA row is defective.

Variations in the invention as described with regard to FIG. 1 may be envisioned by those having skill in the art. For example, test line 26 and connecting element 27 may be dispensed with, and the OR array itself used for testing the personalization of AND array 11 on a row-by-row basis. This may be accomplished by personalizing both the AND and OR arrays of a given row at the same time. A digital input pattern which activates the personalized row is then applied to PLA input lines 23. PLA output lines 24 are tested for the proper response. If the response is proper then personalization of the given row (for both AND and OR arrays) is proper. The given row is then disabled by connecting its deleting element 29 to deletion control line 28, and testing may proceed on the remainder of the PLA rows.

Figure 2:
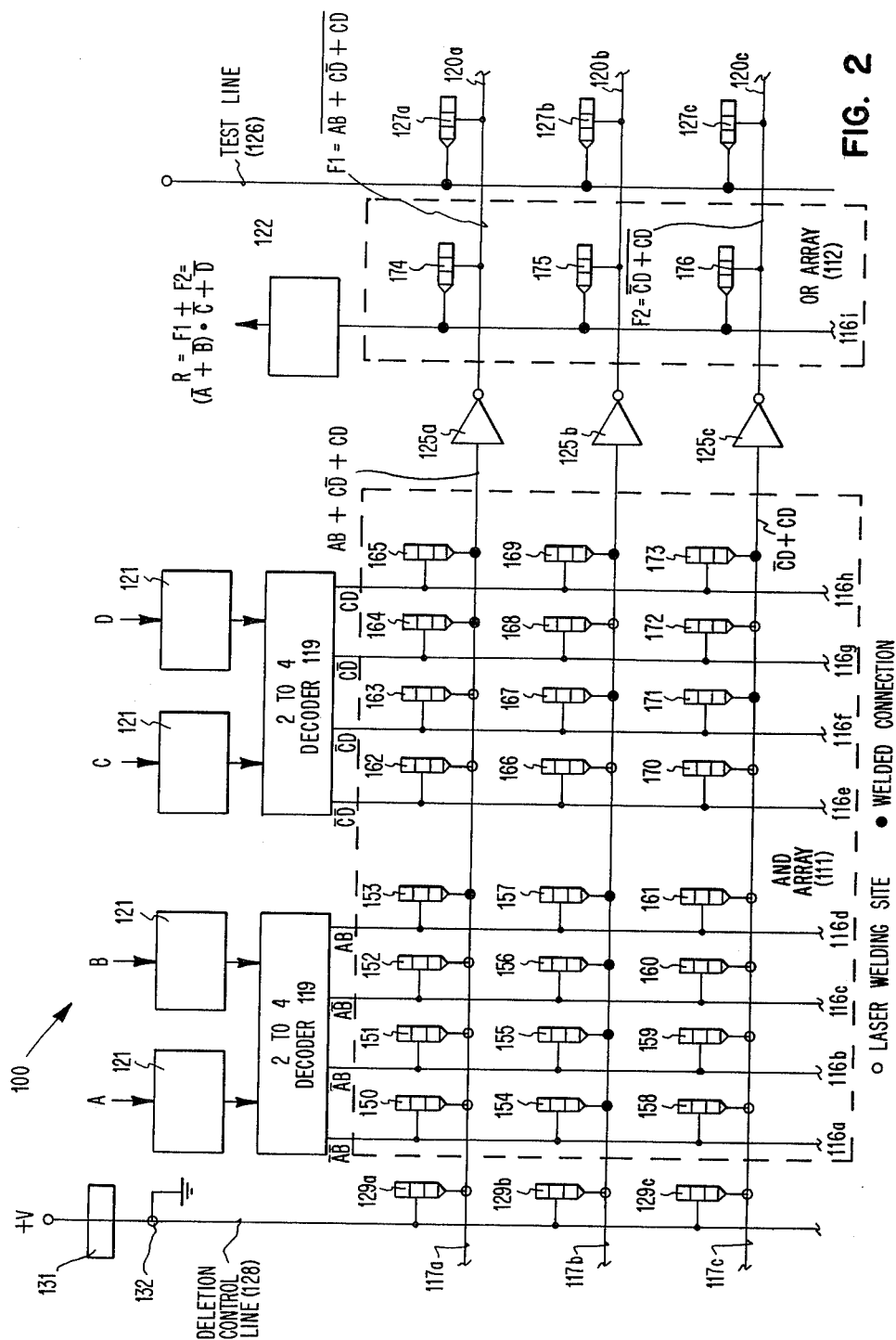
FIG. 2 is a detailed schematic of a small scale bipolar transistor PLA in which the present invention is embodied.

In order to better describe the detailed operation of the invention, a specific example of a small scale PLA is illustrated in FIG. 2. It will be recognized by those having skill in the art that the PLA of FIG. 2 contains all the elements of a commercially available PLA, albeit in reduced numbers for the sake of simplicity of description.

Referring now to FIG. 2, a small scale PLA 100 using bipolar technology and logic levels of $+V$ volts and 0 volts for logic high (1) and logic low (0), respectively, is illustrated. The array has four logical inputs, A, B, C and D and is personalized to generate the logic function $R = (\overline{A+B}) \cdot \overline{C} + \overline{D}$. The PLA architecture includes inverters 125a–125c between the outputs 117a–117c of AND array 111 and the inputs 120a–120c of OR array 112. Test line 126 includes a plurality of connecting elements 127a–127c. Deletion control line 128 includes a plurality of deleting elements 129a–129c. It will be noted that connecting elements 127, deleting elements 129 and logical elements 150–176 are all bipolar NPN transistors. The collectors of all the NPN transistors are connected to V volts, however this connection is not shown in FIG. 2 for the sake of clarity.

In FIG. 2, open laser welding sites are shown by open circles while laser welded connections are shown by blackened circles. Initially, all laser welding sites on the PLA are open.

The PLA of FIG. 2 further includes four input latches 121 and an output latch 122. The PLA is of the bit partition type, i.e., logical inputs A, B, C and D are passed through a pair of 2 to 4 decoders 119, to generate the four logical functions of two input variable pairs, i.e., $AB$, $\bar{A}B$, $A\bar{B}$, and $AB$. Bit partitioning of a PLA is well known to those having skill in the art and will not be further described here.

The PLA of FIG. 2 includes a deletion control line 128 and deleting elements 129a–129c in accordance with the present invention. Prior to personalization, deletion control line 128 is connected to +V volts (logic high).

Personalization and testing of the PLA of FIG. 2 in accordance with the subject invention proceeds as follows: Row 117a is personalized according to a predetermined pattern; i.e., transistors 153, 164 and 165 are laser welded to form the logical function $AB + C\bar{D} + CD$. Connecting element 127a is laser welded. The operability of the transistors connecting row 117a and the proper personalization thereof is then tested by applying an input to input lines A, B, C and D which will activate row 117a. Such an input may be represented by ABCD=1000.

If the personalization of row 117a is proper, then upon application of the above input pattern, row 117a will be activated, corresponding in this example to logic low. Conversely, if personalization is improper, row 117a will be high. As a result of the presence of inverter 125a, corresponding OR array row 120a will be high for proper personalization and low for improper personalization. Thus, proper personalization is verified by test line 126 being high upon application of an input pattern which activates row 117a. It will be noted further that since transistors 127b and 127c have not yet been laser welded, interference by unpersonalized rows 120b and 120c with the output of test line 126 is precluded, regardless of the logical state of rows 120b and 120c.

Assuming personalization of row 117a is proper, the process proceeds by personalizing the first row 120a of OR array 112 by laser welding transistor 174. The proper personalization of row 120a is then tested by applying the same input as was applied for row 117a, i.e., ABCD=1000 and observing the response of array output element 116i. If column 116i is high then personalization is proper. Conversely, if personalization is improper, column 116i (the output of which is stored in output latch 122) is low.

In order to disable row 117a so as to preclude interference with further testing of rows 117b and 117c, transistor 129a is laser welded to connect deletion control line 128 with row 117a. Since the deletion control line is connected to +V, row 117a will always be at logic high thus rendering row 120a at logic low thus ensuring that transistor 127a is always off. Test line 126 therefore is never activated by row 120a.

Assuming personalization of the first PLA row was proper, personalization of row 117b may commence in a manner analogous with row 117a. Row 117b is personalized according to a predetermined pattern, i.e., transistors 167 and 169 are laser welded to form a logical function $\bar{C}D+CD$. (It will be noted that in FIG. 2, transistors 154–157 are also laser welded, for purposes which are described below in connection with the permanent deactivation of row 117b). Connecting element 127b is laser welded. The operability of the transistors connecting row 117b and the proper personalization thereof is then tested by applying an input to lines A, B, C, D which will drive row 117b low. Such an input may be represented by ABCD=1000.

In order to illustrate another aspect of the invention, assume there is a defect in the personalization of row 117b. Then, row 117b will be high in the presence of input ABCD=1000. Due to the effect of inverter 125b, row 120b will be low. Test line 126 will therefore be low and the improper personalization of row 117b is signalled.

Referring to FIG. 2, it will be seen that the PLA includes spare row 117c. Then, according to the invention, spare row 117c may be substituted for defective row 117b. Defective row 117b may be permanently rendered inactive by laser welding all four outputs of a 2 to 4 decoder 119 in the defective row 117b. In FIG. 2, transistors 154–157 are all laser welded. By welding all four outputs of a 2 to 4 decoder 119, it is assured that no matter what logical values A or B takes on, one of the transistors 154–157 will always be on thus driving row 117b to its logic high state and driving row 120b to its logic low state. Row 120b therefore can never contribute to the output of the PLA for any possible input bit pattern. Row 117b is thus effectively removed from the PLA.

Redundant row 117c may then be personalized with the same input pattern as was originally done to row 117b, i.e., transistors 171 and 173 are laser welded. Connecting element 127c is laser welded. Testing with input pattern ABCD=1000 is performed for row 117c. Assuming proper personalization, row 117c will be low and row 120c high. It will be noted that the outcome of tests on row 117c are not affected by the personalization of prior rows, e.g., row 117a, because the deletion control element 129a disables row 117a after it has been personalized. The only way that test line 126 can be driven high is by transistor 127c, thus signifying proper personalization of row 117c.

After the personalization of row 117c of AND array 111 is verified, row 120c of OR array 112 may be personalized by laser welding transistor 176 to column 116i. The proper laser personalization may be verified by observing the output of column 116i in output latch 122, as was described with respect to row 120a above. Again, it will be noted that the only way output column 116i may be activated is via transistor 176, since transistor 174 in row 120a has been disabled by the deletion control line.

In the above procedure, the personalization of each row of AND array 111 was tested by monitoring test line 126. The proper personalization of each row of OR array 112 was tested by monitoring the output of the OR array itself. It will be understood by those having skill in the art, however, that test line 126 may be eliminated and the personalization of the AND array verified by monitoring the output of the OR array. This may be accomplished by personalizing both the AND and OR array for a given row before testing the personalization of the row, as was described with regard to FIG. 1. It will be further understood by those having skill in the art that connecting elements 127 may be permanently connected to test line 126, if the PLA design incorporates means for maintaining unpersonalized AND array rows 117 at logic high, thus precluding interference by an unpersonalized row with the activation of test line 126.

When the entire array has been personalized and tested in accordance with the above procedure, deletion control line 128 is deactivated by removing the deletion control line from the +V volt source and grounding the deletion control line. This may be accomplished by laser cutting the deletion control line at point 131 and laser welding the deletion control line to ground by laser welding at 132. Since deletion control line 128 is now grounded, transistors 129 are off and rows 117a–117c may be activated in accordance with the PLA input bit pattern. Deletion control line 128 is effectively removed from the circuit.

From the above description it will be seen that the present invention may be employed in logic arrays of various configurations and sizes. Further, the invention is not technology dependent as it may be readily adapted to logic arrays employing FET, Schottky or other technology. It is also well known to those having skill in the art that a single chip may employ a folded array structure wherein two PLA's are incorporated thereon in a mirror image configuration. In such a case, each PLA may incorporate a separate deletion control line, as each PLA in the folded array is essentially independent.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

I claim:

1. A programmable logic array comprising:
    a plurality of input columns for accepting digital input signals;
    a plurality of output columns for providing digital output signals which are a predetermined logical function of said input signals;
    a plurality of rows intersecting said input columns and said output columns;
    a matrix of logic performing elements located at the intersection of at least some of said input and output columns and said rows for generating said predetermined logical function;
    a deletion control line intersecting said rows;
    means for connecting said deletion control line to selected rows to thereby prevent the logic performing elements connected to said selected rows from contributing to said predetermined logical function upon activation of the logic performing elements connected to said selected rows by an appropriate digital input signal at said input columns, and thereby permit testing of a row which is not connected to said deletion control line without interference from said selected rows; and
    means for disabling said deletion control line to thereby permit the logic performing elements connected to said selected rows to contribute to said predetermined logical function, notwithstanding the connection of said selected rows to said deletion control line;
    whereby the proper operation of the logic performing elements in a row which is not connected to said deletion control line may be verified without interference from the logic performing elements connected to said selected rows.

2. The logic array of claim 1 further comprising:
    a spare row intersecting said input columns and said output columns;
    a plurality of logical elements located at the intersection of at least some of said input and output columns and said spare row; and
    means for substituting said spare row for the row which is not connected to said deletion control line if the row which is not connected to said deletion control line is not activated by an appropriate digital input signal on said input columns.

3. A programmable logic array comprising:
    a plurality of input columns for accepting digital input signals;
    a plurality of output columns for providing digital output signals which are a predetermined logical function of said input signals;
    a plurality of rows intersecting said input columns and said output columns;
    a matrix of logic performing element located at the intersections of at least some of said input and output columns and said rows for generating said predetermined logical function;
    means for maintaining selected rows at an inactive logical state to thereby prevent the logic performing elements connected to said selected rows from contributing to said predetermined logical function upon activation of logic performing elements connected to said selected rows by an appropriate digital input signal at said input columns, and thereby permit testing of a row which is not maintained at said inactive logical state without interference from said selected rows; and,
    means for disabling said maintaining means to thereby permit the logic performing elements connected to said selected rows to contribute to said predetermined logical function notwithstanding the connection of said selected rows to said maintaining means;
    whereby the proper operation of the logic performing elements in a row which is not maintained at said inactive logical state may be verified without interference from the logic performing elements connected to said selected rows.

4. The programmable logic array of claim 3 further comprising:
    a spare row intersecting said input columns and said output columns;
    a plurality of logic performing elements located at the intersection of at least some of said input and output columns and said spare row; and
    means for substituting said spare row for the row which is not maintained at said inactive logical state if the row which is not maintained at said inactive logical state is not activated by an appropriate digital input signal on said input columns.

5. In a programmable logic array, comprising a plurality of input columns, a plurality of output columns, a plurality of rows intersecting said input columns and said output columns, and a matrix of logic performing elements located at the intersections of at least some of said input and output columns and said rows, a method of testing the operation of the programmable logic array comprising the steps of:
    personalizing the logic performing elements in the first array row by connecting or disconnecting the logic performing elements to or from said first row in a predetermined pattern so that the logic performing elements in said first row activate said first row in response to a predetermined digital input signal on said input columns;

applying said predetermined digital input signal to said input columns to thereby activate said first row;

verifying that said first row is activated in response to said predetermined digital input signal;

disabling said first row so that it cannot be activated, notwithstanding activation of the logic performing elements thereof; and, successively repeating the above steps for each array row.

6. The method of claim 5 further including the step of connecting or disconnecting the logic performing elements in the first array row to form a nonexistent digital function, if the first row is not activated during said verifying step.

7. The method of claim 5 further including the step of connecting or disconnecting the logic performing elements associated with an unused one of said rows in said predetermined pattern if the first row is not activated during said verifying step.

8. The method of claim 5 wherein the programmable logic array includes a deletion control line intersecting said plurality of rows and wherein said disabling step includes the step of connecting said first row to said deletion control line.

* * * * *